US005822768A

United States Patent [19]

Shakkarwar

[11] Patent Number: 5,822,768

[45] Date of Patent: *Oct. 13, 1998

[54] DUAL PORTED MEMORY FOR A UNIFIED MEMORY ARCHITECTURE

[75] Inventor: Rajesh Shakkarwar, Santa Clara, Calif.

[73] Assignee: OPTi Inc., Milpitas, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 583,970

[22] Filed: Jan. 11, 1996

[51] Int. Cl.[6] ...................... G06F 12/00

[52] U.S. Cl. ...................... 711/149

[58] Field of Search ...................... 365/230.05; 395/507; 711/147, 149, 150

[56] References Cited

U.S. PATENT DOCUMENTS

| | | | |
|---|---|---|---|
| 4,663,735 | 5/1987 | Novak et al. | 365/233 |
| 4,858,190 | 8/1989 | Yamaguchi et al. | 365/230.05 |
| 4,912,680 | 3/1990 | Masaki et al. | 365/230.09 |
| 4,984,214 | 1/1991 | Hiltebeitel et al. | 365/230.05 |
| 4,987,559 | 1/1991 | Miyauchi et al. | 365/230.05 |
| 4,992,985 | 2/1991 | Miyazawa et al. | 365/201 |
| 5,436,870 | 7/1995 | Sato et al. | 365/230.05 |
| 5,524,098 | 6/1996 | Holland et al. | 365/230.05 |
| 5,579,458 | 11/1996 | Yokosuka et al. | 395/507 |

*Primary Examiner*—Eddie P. Chan
*Assistant Examiner*—Gary J. Portka
*Attorney, Agent, or Firm*—Fliesler, Dubb, Meyer & Lovejoy LLP

[57] ABSTRACT

A unified memory architecture includes a dual ported memory, core logic and a serial controller. The dual ported memory contains a random access port and a serial port to support concurrent accesses, after an initial serial port set-up time, through the serial port and the random access port. The core logic handles accesses to the random access port on the dual ported memory for all devices except the serial controller. The serial controller also accesses the dual ported memory through the random access port, and it also receives serial data, for use in a serial data operation, through the serial port. The serial controller generates a serial port load command through the random access port to effectuate the serial data transfer. The serial controller may be a graphics controller that utilizes the dual ported memory as a frame buffer. For this embodiment, the graphics controller executes screen refresh operations through use of the serial port. A serial port load command is defined for both a synchronous and an asynchronous interface for the dual ported memory.

25 Claims, 11 Drawing Sheets

DUAL PORTED MEMORY FOR A UNIFIED MEMORY ARCHITECTURE

BACKGROUND OF THE INVENTION

1. Field of the Invention

The present invention is directed toward the field of computer systems, and more particularly to a dual ported memory for a unified memory architecture.

2. Art Background

FIG. 1 is a block diagram illustrating a unified memory architecture for a computer system. As shown in FIG. 1, the computer system contains a central processing unit (CPU) 100 coupled to core logic 110 through a host address, data & control bus. The unified memory computer architecture contains a single physical system memory labeled 140 on FIG. 1. The unified memory computer architecture also contains a unified memory architecture (UMA) device 130. The UMA device is often a graphics controller. As shown in FIG. 1, the UMA device 130 and the core logic 110 access the physical system memory 140 through a memory, address, data & control bus 160. Thus, the physical system memory 140 is shared between core logic 110 and the UMA device 130.

The unified memory architecture further includes a local bus 120 coupled to the core logic 110 and the UMA device 130. The local bus 120 may connect several peripheral devices to the system. Physical system memory 140 accesses, whether originating from the CPU 100 or from peripheral devices on the local bus 120, are executed by the core logic 110. The UMA device 130 directly accesses the physical system memory 140. Therefore, because the core logic 110 and UMA device 130 access the physical system memory 140 via the same memory data and control bus 160, an arbitration scheme is employed to arbitrate accesses between the two memory masters.

In one implementation of the unified memory architecture, the UMA device 130 is a graphics controller. In general, a graphics controller utilizes memory, known as a frame buffer, to render graphical data on an output display. For the unified memory architecture, the UMA device 130, when operating as a graphics controller, utilizes a portion of the physical system memory 140 as a frame buffer. The portion of the physical system memory used for the frame buffer is labeled frame buffer 150 in FIG. 1.

The graphics controller requires two types of accesses to the physical system memory 140. First, the graphics controller accesses the frame buffer 150 portion of the physical system memory 140 to manipulate graphics data (e.g. paint the frame buffer with graphical data). Also, the graphics controller accesses the frame buffer 150 portion of the physical system memory 140 to execute screen refresh operations. In a screen refresh operation, graphics data are retrieved from the frame buffer 150 and processed for display on the output display. The screen refresh accesses are extremely time critical. If the screen refresh operations are not performed in a timely manner, the screen images become corrupted.

One problem associated with use of the unified memory architecture is the high physical system memory data bandwidth requirement of the graphics controller to properly execute the screen refresh operations. The data bandwidth requirement for a screen refresh operation varies, depending upon the graphics mode used, between 20 megabytes per second (MB/s) to 180 megabytes per second (MB/s). To meet these high data bandwidth requirements, the graphics controller requires access to the physical system memory 140 for substantial amounts of time. However, this results in system performance degradation because the core logic 110, which accesses the memory for other components in the computer system, is denied access during the screen refresh access. For example, if the CPU 100 requires access to the physical system memory 140 during screen refresh access, then the CPU 100 is forced to stall, thereby causing a system performance degradation.

In prior art systems, a first-in-first-out (FIFO) buffer is incorporated into the graphics controller to reduce the number of times the graphics controller accesses the physical system memory 140. The buffer stores graphics data for use in the screen refresh operation. If the buffer in the graphics controller is large, then the number of accesses by the graphics controller to the physical system memory 140 for a screen refresh operation are reduced. However, because of several design and cost considerations, the size of the graphics controller buffer is typically small. Therefore, the graphics controller still requires frequent access to the physical system memory 140 to execute a screen refresh operation, which in turn, results in performance degradation for other memory masters.

The system performance degradation exhibited in these unified memory architecture systems is a primary reason that the unified memory architecture is not utilized in many computer systems. As is explained below, the present invention provides a dual ported memory to support the unified memory architecture without the system performance degradation exhibited by prior art unified memory architecture systems.

SUMMARY OF THE INVENTION

A unified memory architecture includes a dual ported memory for use as system memory as well as memory for a serial controller. The serial controller is coupled to the dual ported memory, and memory masters, such as a central processing unit or peripheral devices, access the dual ported memory through core logic. The dual ported memory contains a random access port and a serial port to support concurrent accesses, after an initial serial port setup time, through the serial port and the random access port. The core logic handles accesses to the random access port on the dual ported memory for all devices except the serial controller. The serial controller also accesses the dual ported memory through the random access port, and it receives serial data, for use in a serial data operation, through the serial port. The serial controller generates a serial port load command through the random access port to effectuate the serial data transfer.

In one embodiment, the serial controller is a graphics controller that utilizes part of the dual ported memory as a frame buffer. The remaining portion of the dual ported memory is used as system memory. To execute a screen refresh operation, the graphics controller generates the serial port load command to receive serial data via the serial port. The dual ported memory transmits data from the serial port, and it permits concurrent memory access via the random access port. Thus, screen refresh operations may be executed concurrent to memory access requests by a memory master device, such as a central processing unit, a peripheral device or a serial controller.

In one embodiment for an asynchronous dual ported memory interface, the serial port load command is executed through use of a row address strobe bar (RAS#) signal, a column address strobe bar (CAS#) signal, and a write enable bar (WE#) signal. To generate the serial port load command, the serial controller generates an active CAS# signal before an active RAS# signal sequence while driving the WE# to a low logic level. Also, a row address is provided to identify a row in the dual ported memory that contains the bit sequence for the serial data transfer. In a subsequent CAS# cycle, a start address is provided to specify the bit in the row that begins the bit sequence.

For the embodiments described herein, the dual ported memory is a dynamic random access memory (DRAM). The dual ported memory recognizes a DRAM refresh command. Specifically for the asynchronous interface, the DRAM refresh command is a CAS# before RAS# signal sequence with the WE# signal driven to a high logic level. Thus, the state of the WE# signal differentiates the DRAM refresh command from the serial port load command.

In another embodiment for a synchronous dual ported memory interface, the serial port load command is executed through use of a clock, chip select bar (CS#), write enable bar (WE#), row address strobe bar (RAS#), column address strobe bar (CAS#), and clock enable (CKE) signals. The serial port load command for the synchronous interface is signified by the CS# and the WE# signals being a low logic level during a rising edge of the clock signal and by the CAS#, the RAS#, and the CKE signals being a high logic level during the rising edge of the clock signal.

In the synchronous dual ported memory embodiment, address information is defined in the serial port load command such that a bank identification and a start address are valid on the address inputs during the rising edge of the clock signal. A conventional synchronous DRAM command, which accesses a row of memory with a specified row address in a specified bank, is issued prior to issuing the synchronous serial port load command of the present invention. The address information in the synchronous serial port load command includes the start address of the bit in the open row in the desired bank that begins the bit sequence. Also, for the synchronous dual ported memory interface embodiment, a conventional synchronous DRAM refresh command is used for the DRAM refresh operation.

DETAILED DESCRIPTION OF THE PREFERRED EMBODIMENTS

Figure 1:
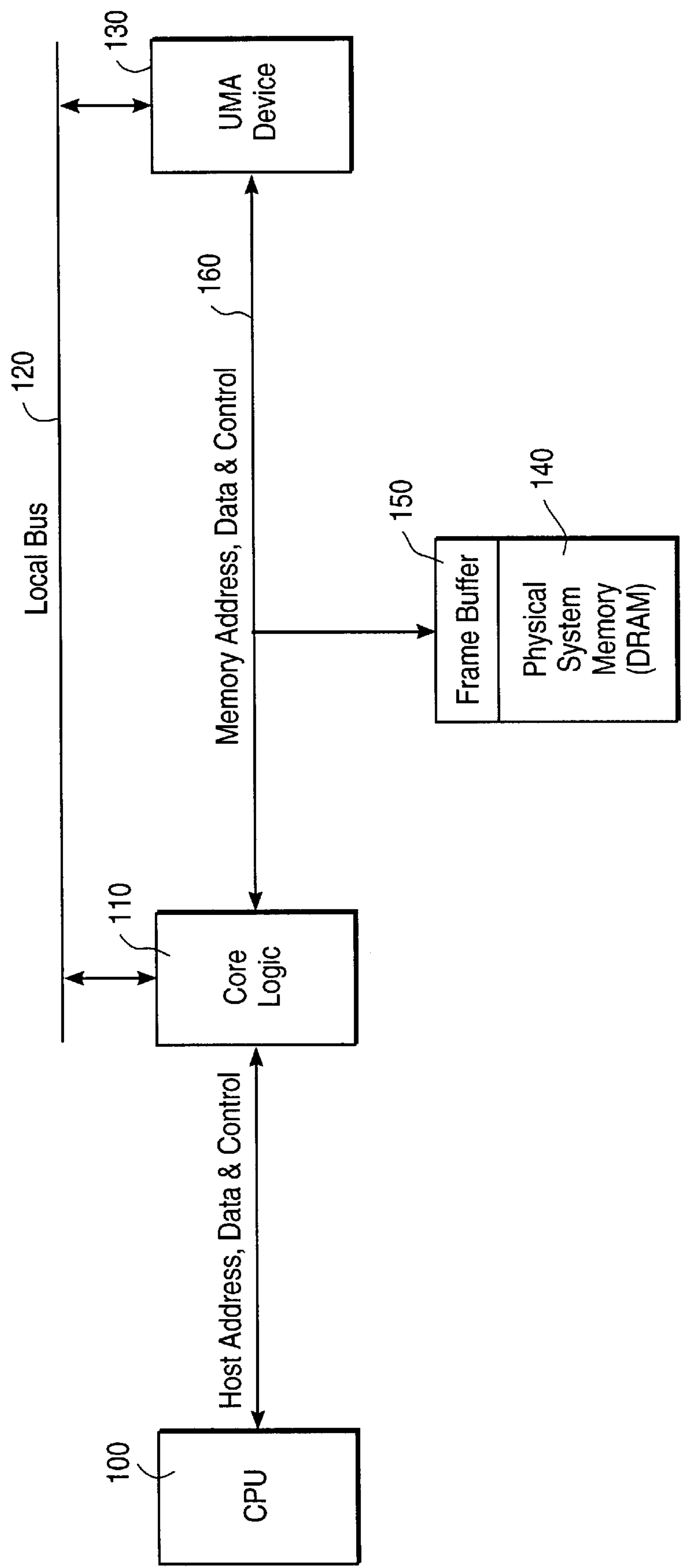
FIG. 1 is a block diagram illustrating a prior art unified memory architecture for a computer system.
Figure 2:
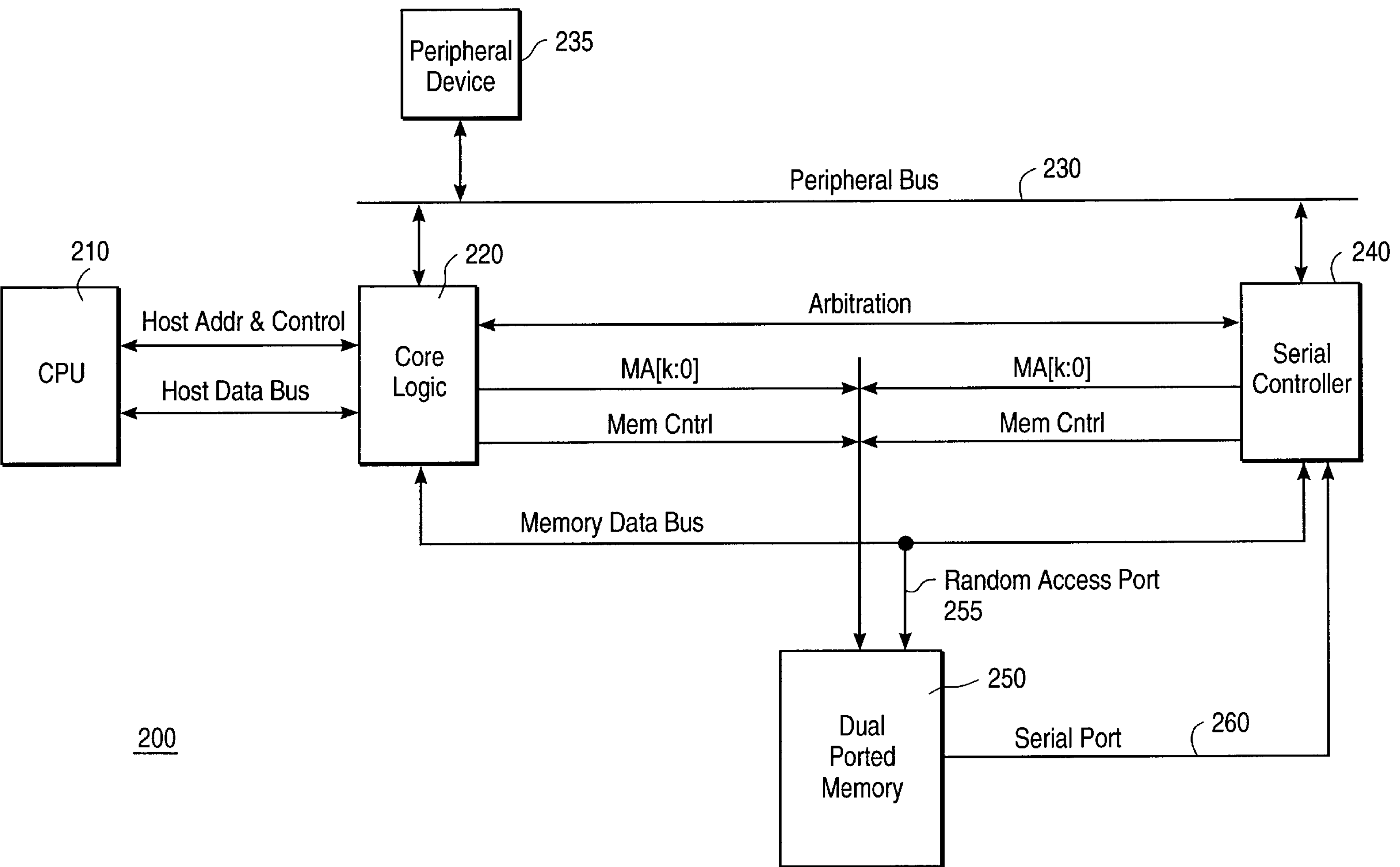
FIG. 2 is a block diagram illustrating a portion of a computer system implementing the unified memory architecture of the present invention.

FIG. 2 is a block diagram illustrating a portion of a computer system implementing the unified memory architecture of the present invention. A unified memory architecture system 200 includes a dual ported memory 250 as the physical system memory. In one embodiment, the dual ported memory 250 contains a random access port 255 and a serial port 260. Also, in one embodiment, the dual ported memory 250 is constructed as one or more banks of dynamic random access memory (DRAM). The unified memory architecture system also includes core logic 220 and a serial controller 240. The core logic 220 and the serial controller 240 are coupled to the dual ported memory 250 to share the single memory.

As shown in FIG. 2, the core logic 220 and serial controller 240 arbitrate for use of the dual ported memory 250 through use of the random access port 255. Specifically, core logic 220 and the serial controller 240 share memory control signals (Mem Cntrl), memory address lines (MA [k:0]), and a memory data bus. The "k" address lines are used to uniquely identify addressable portions of the dual ported memory 250, and the value of "k" is dependent upon the size and configuration of the memory cells within the dual ported memory 250. Thus, the unified memory architecture configuration supports memory access to the random access port 255 from either the core logic 220 or the serial controller 240. To support this, an arbitration scheme is utilized to allocate the use of the random access port 255 to either the core logic 220 or the serial controller 240. Techniques to implement an arbitration scheme for a bus, such as a memory bus, are well known in the art, and any type of arbitration scheme may be utilized to assign memory bus resources for the random access port 255 without deviating from the spirit and scope of the invention.

In one embodiment, an arbiter, which is implemented in the core logic 220, permits arbitration at two or more different levels of priority at different times. For this embodiment, only two conductors are used to communicate between the serial controller 240 and arbiter and between the core logic 220 and the arbiter: one request signal line and one grant signal line. In order to assert a request for control of the random access port 255, the serial controller 240 or the core logic 220 drive the request signal line to a predefined logic level. The arbiter considers this a low priority request for control of the shared resource, and the arbitration proceeds accordingly. Then, if the requester's request is a high priority request, or if it was originally a low priority request and has now become a high priority request, the requester device drives the request signal to the opposite logic level to thereby increase the priority level of its request. In either case, the arbiter grants control of the random access port 255 by asserting the device grant signal to the requesting device.

The unified memory architecture system 200 also includes a central processing unit (CPU) 210 coupled to the core logic 220 via a host address & control bus and a host data bus. The CPU 210 executes all memory operations to the dual ported memory 250 through the core logic 220. The unified memory architecture 200 further includes a peripheral bus 230. In one embodiment, the peripheral bus 230 comprises a peripheral component interconnect (PCI) bus. The PCI-bus standard is defined in Intel Corp., "Peripheral Component Interconnect (PCI), revision 1.0 Specification" (Jun. 22, 1992), in PCI Special Interest Group, "PCI Local Bus Specification", Revision 2.0 (Apr. 30, 1993), and in PCI Special Interest Group, "PCI Local Bus Specification", Rev. 2.1 (Jun. 1, 1995), all incorporated herein by reference.

In one embodiment, one or more memory masters, such as peripheral device 235, are coupled to the peripheral bus 230. All peripheral devices coupled to peripheral bus 230 that require access to the system memory 250 are handled through the core logic 220. For example, for the PCI bus implementation, external masters, such as PCI masters and ISA masters, access dual ported memory 250 through the core logic 220. The core logic 220 is intended to represent a broad category of devices that interface several memory masters to the system memory 250, which are well known in the art. In one embodiment, the core logic 220 may be implemented with a chip set that includes devices with part numbers 82C566M, 82C567M, and 82C568M, manufactured by OPTi, Inc., Milpitas, Calif.

As shown in FIG. 2, the serial controller 240 is coupled to the dual ported memory 250 both via the random access port 255 and the serial port 260. In one embodiment, the serial controller 240 is a graphics controller utilized in a graphics subsystem for a computer. In a typical graphics subsystem, the graphics controller or graphics accelerator performs graphics algorithms on data stored in the frame buffer prior to rendering the graphics data on an output display. For the unified memory architecture shown in FIG. 2, the frame buffer memory is implemented as part of the dual ported memory 250. Therefore, the graphics controller accesses the dual ported memory 250 to perform data manipulation functions on the graphics data stored in the frame buffer portion. When a data manipulation operation is desired, the serial controller 240 arbitrates with the core logic 220 for exclusive use of the random access port 255. The access operation to either read or write to a dynamic random access memory (DRAM), such as an operation to read and write to the random access port on the dual ported memory 250, is well known in the art and will not be described further.

The serial port 260 on the dual ported memory 250 allows only sequential reads to the serial controller 240. As is described more fully below, in one embodiment, the serial controller 240 arbitrates for use of the memory bus, and it sends a serial port load command to the random access port 255 to receive serial data from the serial port 260. In response to the serial port load command, the dual ported memory 250 transmits, in each clock cycle, "i" bits of serial data. The sequential read refers to reading bits that are stored sequentially (e.g. adjacent bits) in the dual ported memory 250. For example, a sequential read may include reading graphics data from column "0" to column "n−1" in a specified row of the dual ported memory 250.

The sequential read by the graphics controller to execute a screen refresh operation takes advantage of the sequential arrangement of graphics data in a frame buffer. Although the present invention is described in conjunction with a graphics controller as a serial controller 240, any device that utilizes sequential reads may benefit from the unified memory architecture of the present invention. For example, the serial controller 240 may comprise a sound card for manipulating and generating audio signals. A sound card also utilizes sequential reads of audio data from a memory to generate the composite audio output. Similarly, any type of digital signal processor (DSP), such as a multi-media processor, that utilizes sequential reads to perform one or more functions, may be implemented as the serial controller 240 without deviating from the spirit or scope of the invention.

The dual ported memory 250 of the present invention provides enhanced system performance over conventional unified memory architectures. Specifically, with use of the dual ported memory 250, the serial controller 240 may execute sequential reads through the serial port 260 at the same time the serial controller 240 or core logic 220 accesses the dual ported memory 250 via the random access port 255. For the graphics controller implementation, the use of the serial port 260 significantly reduces the number of accesses required to the system memory to successfully execute a screen refresh operation over the common interface (e.g. the random access port). Consequently, through use of the dual ported memory 250, unified memory architectures for UMA devices that use sequential data are greatly enhanced.

Unified memory architectures have application for use in computer systems. Currently, personal computers (PCs) support four types of dynamic random access memories (DRAMs). Specifically, PCs typically support fast page mode, extended data out (EDO), burst EDO, and synchronous DRAMs. The DRAMs may be divided into two groups based on the interface utilized to access the devices. DRAMs that utilize an asynchronous interface do not have a clock input, and all of the control signals are asynchronous. For an asynchronous interface DRAM, address and data are latched on the falling edges of control signals. Fast page mode DRAMs, EDO DRAMs, and burst EDO DRAMs are accessed with an asynchronous interface. DRAMs that are controlled with synchronous interfaces have a clock input. All of the control signals are sampled on a clock edge of the interface clock. Address and data are latched on the clock edges. Synchronous DRAMs utilize this type of synchronous interface.

Figure 3:
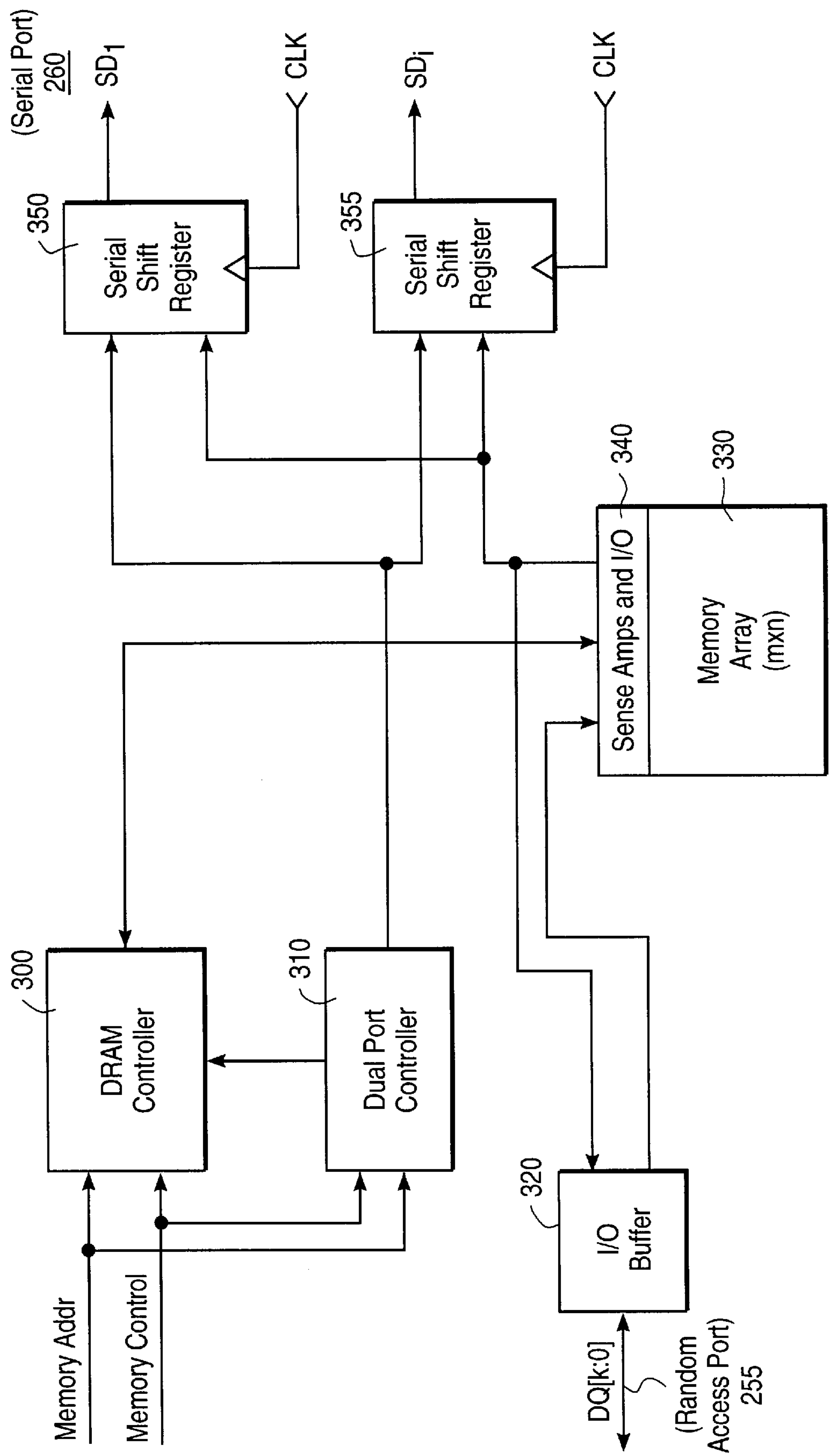
FIG. 3 is a block diagram illustrating one embodiment for a dual ported memory for use with a unified memory architecture.

FIG. 3 is a block diagram illustrating one embodiment for the dual ported memory 250. The dual ported memory 250 includes a memory array 330 that contains a plurality of memory cells. For one embodiment, the memory cells are dynamic random access memory (DRAM) cells. The memory cells in the memory array 330 are arranged in a plurality of "m" rows and "n" columns. The memory array 330 is coupled to a sense amplifiers and input/output (I/O) circuit 340. In general, the sense amplifiers and I/O circuit 340 senses the voltage on selected cells in the memory array 330, and it latches the data sensed from the selected memory cells into a plurality of I/O registers.

The dual ported memory 250 also includes a dynamic random access memory (DRAM) controller 300. In general, the DRAM controller 300 receives memory control and memory address signals, and it performs read and write accesses on the memory array 330 accordingly. For an asynchronous interface on the random access port 255 of dual ported memory 250, the DRAM controller 300 receives, in part, a row address strobe bar (RAS#) signal, a column address strobe bar (CAS#) signal, a write enable bar (WE#) signal, an output enable (OE#) signal, and memory address [k:0] (MA[k:0]) signals. For a synchronous interface on the random access port 255 of dual ported memory 250, the DRAM controller 300 receives, in part, clock (CLK), clock enable (CKE), chip select bar (CS#), row address strobe bar (RAS#), column address strobe bar (CAS#), write enable bar (WE#), and memory address [k:0] (MA[k:0]).

In one embodiment, the DRAM controller 300 includes an address buffer, a row decoder, and a column decoder (not shown). In a DRAM access, the address is multiplexed on the memory address bus (MA[k:0]) during a row address select cycle and a column address select cycle. The address buffer temporarily stores portions of the memory address (MA[k:0]) for the row select and column select portions of the DRAM access. The row decoder receives the row address portion from the address buffer, and it decodes the row address to enable access to a row specified by the address. Similarly, during the column address cycle, the column decoder receives the column address portion from the address buffer, and it decodes the column address to enable access to one or more columns specified by the column address.

As shown in FIG. 3, the sense amplifiers and I/O circuit 340 is coupled to an I/O buffer 320. In turn, the I/O buffer 320 is coupled to the memory data bus DQ[k:0]. Data for a write operation are transferred from the memory data bus to the memory array through the I/O buffer 320 and subsequently through the sense amplifiers and I/O circuit 340. For a read operation, data are transferred from the memory array to the sense amplifier and I/O circuit 340 then to the I/O buffer 320 for subsequent transmission on the memory data bus. The DRAM controller 300 executes those operations typically found in DRAM chips. In fact, the DRAM controller 300 is intended to represent a broad category of such memory devices which are well known in the art and will not be described further.

The dual ported memory 250 further includes a dual port controller 310 and at least one serial shift register 350 as shown in FIG. 3. In general, the serial shift register 350 generates the serial output data for the serial port 260. The serial shift register 350 receives data from the sense amplifiers and I/O circuit 340, in response to a serial port load command, and it outputs serial data synchronous with the clock (CLK). As is described more fully below, the serial shift register 350 may be implemented with multiple serial shift registers, depending upon the number of serial outputs contained on the dual ported memory 250. The dual port controller 310 receives the memory control and memory address signals on the random access port 255 (e.g. the RAS#, CAS#, WE#, and MA[k:0] signals for the asynchronous interface, and the CLK1, CKE, CS#, RAS#, CAS#, WE#, and MA[k:0] for the synchronous interface). In general, the dual port controller 310 coordinates data transfer between the sense amplifiers and I/O circuit 340 and the serial shift register 350 in response to a serial port load command. In addition, for the asynchronous DRAM interface embodiment, the dual port controller 310 interprets the DRAM refresh control command (FIG. 4) for subsequent execution of a DRAM refresh cycle by DRAM controller 300. For the synchronous DRAM interface embodiment, the DRAM controller 300 decodes the DRAM refresh command and executes the DRAM refresh function.

The dual ported memory 250 contains, over a conventional DRAM memory, additional pins for the serial data ($SD_1$–$SD_i$) and a serial clock (CLK). As is described more fully below, no additional pins are required for the dual ported memory 250 to receive the serial port load command. The size of the serial shift register 350, as well as the number of serial data pins ($SD_1$–$SD_i$), is a function of the data bandwidth requirement for the serial controller 240 and the allowable penalty for loading data into the serial shift register 350. In general, the serial shift register 350 stores "q" bits for each serial data load operation, and it shifts "i" output serial bits per clock cycle (e.g. one bit for each output pin ($SD_1$–$SD_i$)) during active serial data transmission.

The number of output serial bits "i" required to meet the serial controller bandwidth requirement is also a function of the clock speed. For example, if a 66 mega hertz (MHz) clock is used, then one output serial data bit per byte (e.g. i=1) generates a 66 megabyte per second (MB/s) serial data flow in a 64 bit computer system. Similarly, two output serial data bits (e.g. i=2) operating with a 66 mega hertz (Mhz) clock results in a data bandwidth of 132 megabytes per second (MB/s) in a 64 bit computer system.

The size or number of bits stored in the serial shift registers 350 and 355 in response to a single serial load command is determined based on the allowable time penalty to load the serial shift registers. If the penalty to load the serial shift registers 350 and 355 is desired to be approximately 1% of the total transmission time, then the following calculation illustrates an example size for a serial shift register that operates with a clock speed of 66 mega hertz (Mhz). If the shift register load time is equal to 200 nano seconds, and that comprises 1% of the transmission time, then the transmission time is approximately 20 micro seconds. The shift register size to transmit data for 20 micro seconds at 66 mega hertz is 1.3 kilobits (e.g. 20 micro seconds divided by 15 ns).

Figure 4:
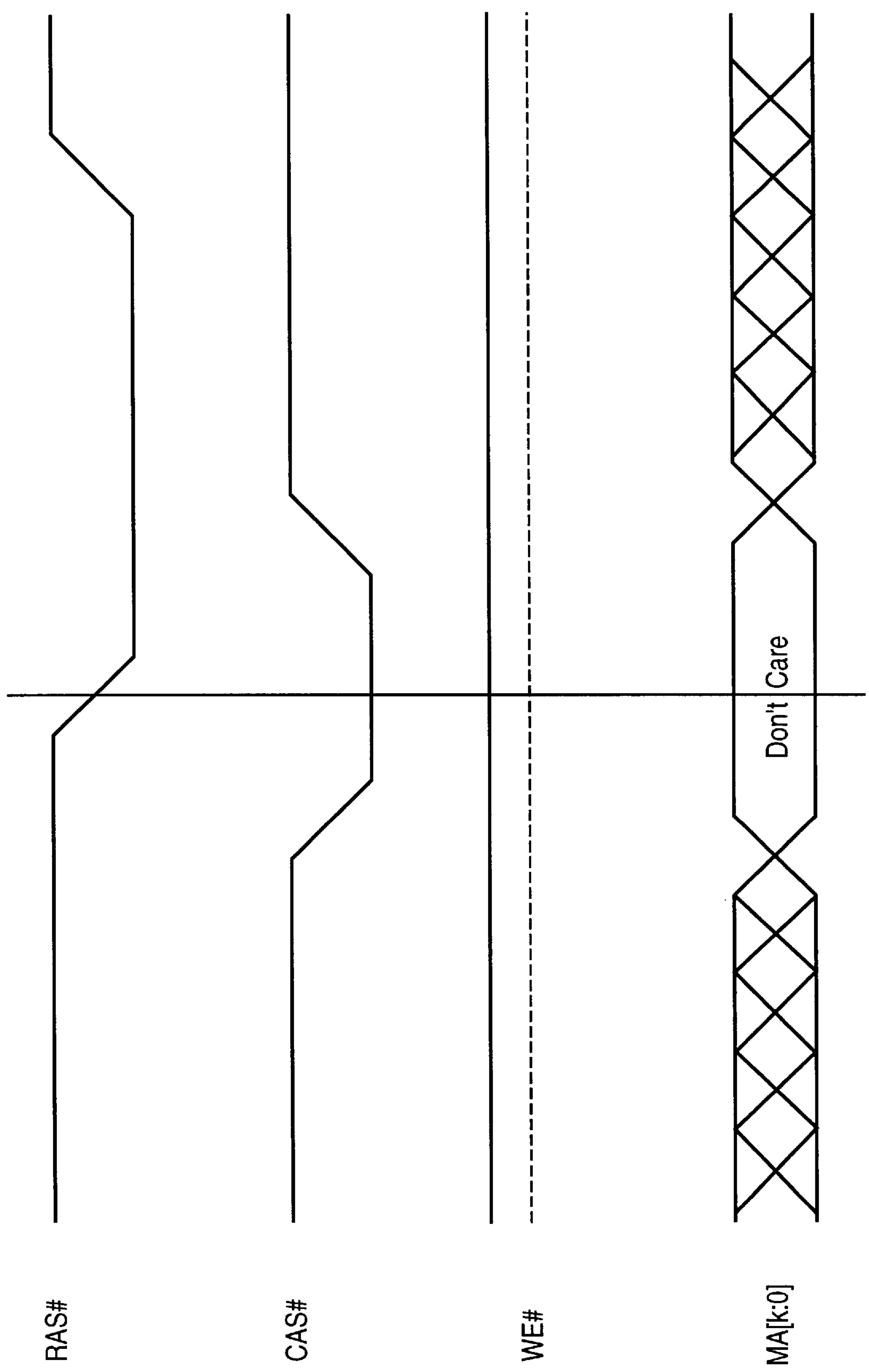
FIG. 4 is a timing diagram that illustrates a DRAM refresh command for the asynchronous interface dual ported memory of the present invention.

FIG. 4 is a timing diagram that illustrates a DRAM refresh command for a DRAM having an asynchronous interface. In one embodiment, the serial port load command is signified, in part, by a CAS# signal before a RAS# signal. For this embodiment, to differentiate the serial load command from a DRAM refresh cycle command, the WE# signal is utilized. As shown in FIG. 4, for an active DRAM refresh cycle, the CAS# signal transitions from a high logic level to a low logic level. Thereafter, the RAS# signal is activated such that the RAS# signal is transitioned from a high logic level to a low logic level. At this time, the WE# signal is held at a high logic level as shown in FIG. 4. Also, for completeness, the memory address on the MA[k:0] lines are ignored (e.g. the memory address is not used for a DRAM refresh cycle). To interpret the DRAM refresh command, the dual port controller 310 samples the WE# signal in response to detecting an active CAS# before RAS# signal sequence. In response to the signal sequence illustrated in FIG. 4, the dual port controller 310 indicates the existence of a DRAM refresh cycle to the DRAM controller 300.

Figure 5:
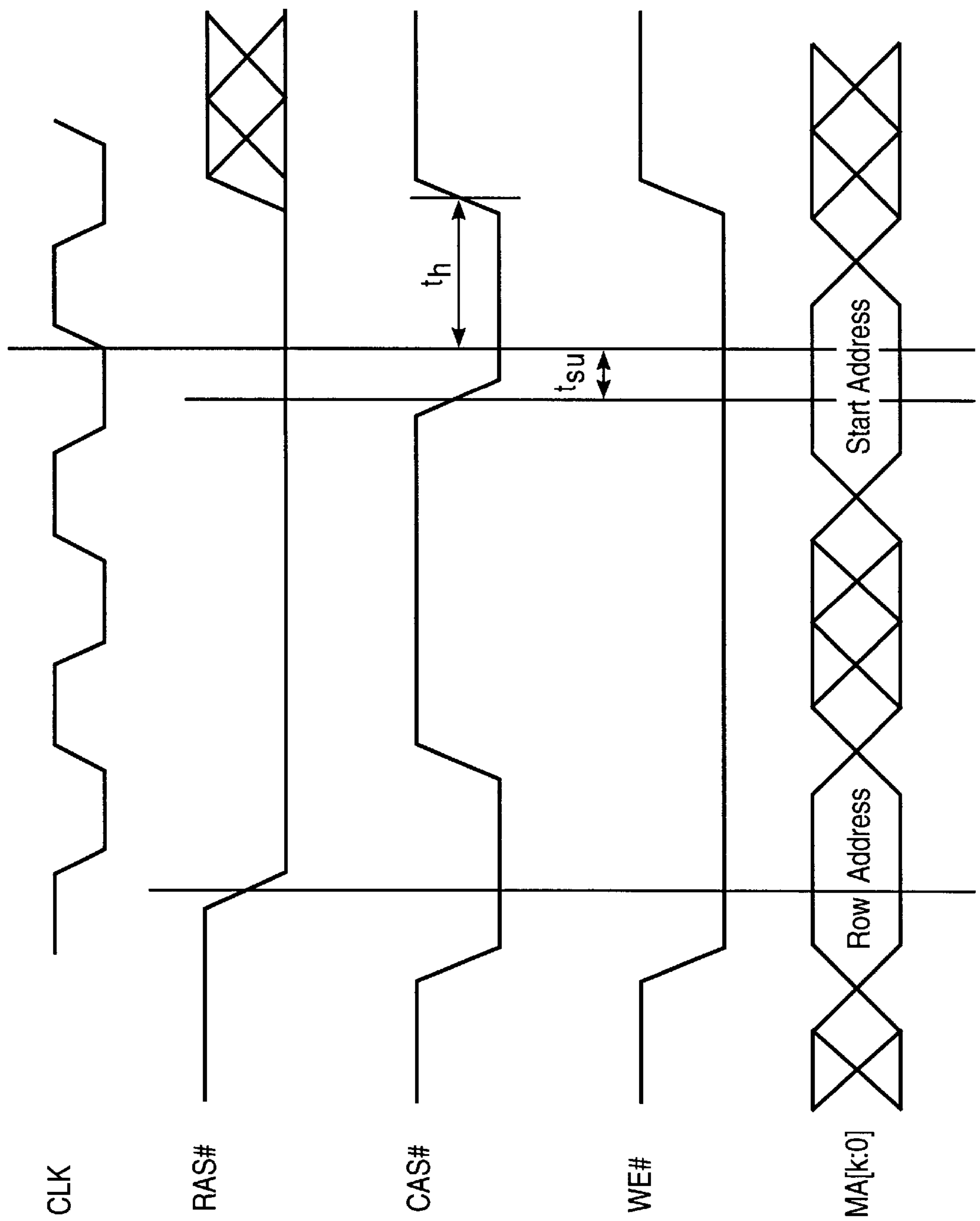
FIG. 5 is a timing diagram illustrating one embodiment for a serial port load command for the asynchronous interface dual ported memory of the present invention.

FIG. 5 is a timing diagram illustrating one embodiment for the serial port load command for use with the asynchronous interface dual ported memory 250. As discussed above, the serial port load command is received on the memory control (Mem Cntrl) and memory address (MA[k:0]) lines on the random access port 255. The dual port controller 310 receives, through the memory address lines (MA[k:0]), a row address and a start address. The row address identifies a row among the "m" rows in the memory array 330 for use in the serial shift register load operation. Thus, the row address identifies "n" bits of sequential data (e.g. one bit for each column in the selected row of the memory array 330). The start address further identifies a bit within the row of sequential bits selected to commence the sequential read. For example, for a selected row, the serial controller 240 may specify, through the start address, that the serial shift register 350 be loaded starting at the ninth bit in the row. Through use of the row and start addresses, any serial sequence of bits stored in a row of the memory array 330 may be identified.

As shown in FIG. 5, the serial port load command commences with a transition of the CAS# signal from a high logic level to a low logic level. In addition, the WE# signal is also transitioned from a high logic level to a low logic level. Thereafter, the RAS# signal is also transitioned from a high logic level to an active low logic level. After detecting the CAS# before the RAS# signal sequence, the dual port controller 310 samples the WE# signal to determine whether the command is a DRAM refresh command or a serial port load command (e.g. high logic level for a DRAM refresh or low logic level for a serial port load command). For the serial port load command shown in FIG. 5, the row address is valid on the falling edge of the RAS# signal. In a subsequent CAS# cycle, wherein the CAS# signal transitions from the low logic level to a high logic level, a second falling edge on the CAS# signal signifies the existence of a valid start address.

As shown in the timing diagram of FIG. 5, the serial port load command is an asynchronous operation between the serial controller 240 and the dual ported memory 250. However, the transfer of the serial data from the serial shift register 350 is a synchronous operation such that serial output data are transmitted on the $SD_1$–$SD_i$ lines each clock cycle. For proper operation, serial controller 240 requires knowledge of a starting clock cycle to identify a clock cycle for which valid data are transmitted on the $SD_1$–$SD_i$.

For the asynchronous interface DRAM embodiment, the serial controller 240 synchronizes the serial data transfer operation to properly interpret the serial data from the serial port 260. As shown in FIG. 5 and as discussed above, the start address is latched on the falling edge of the CAS# signal. Even though the CAS# signal is used in an asynchronous manner to latch the start address, the serial output data must be synchronized with respect to the serial clock (CLK). In general, the setup time ($t_{su}$) and the hold time ($t_h$) for the CAS# signal are fixed parameters that depend on a specific implementation of a dual ported memory device. As is well known in the art, the setup time ($t_{su}$) and the hold time ($t_h$) are the parameters that are required to properly latch data in a storage device, such as a register. The serial controller 240 is required to satisfy the setup time ($t_{su}$) and the hold time ($t_h$) parameters for the CAS# signal for proper execution of a serial port load command.

Figure 6:
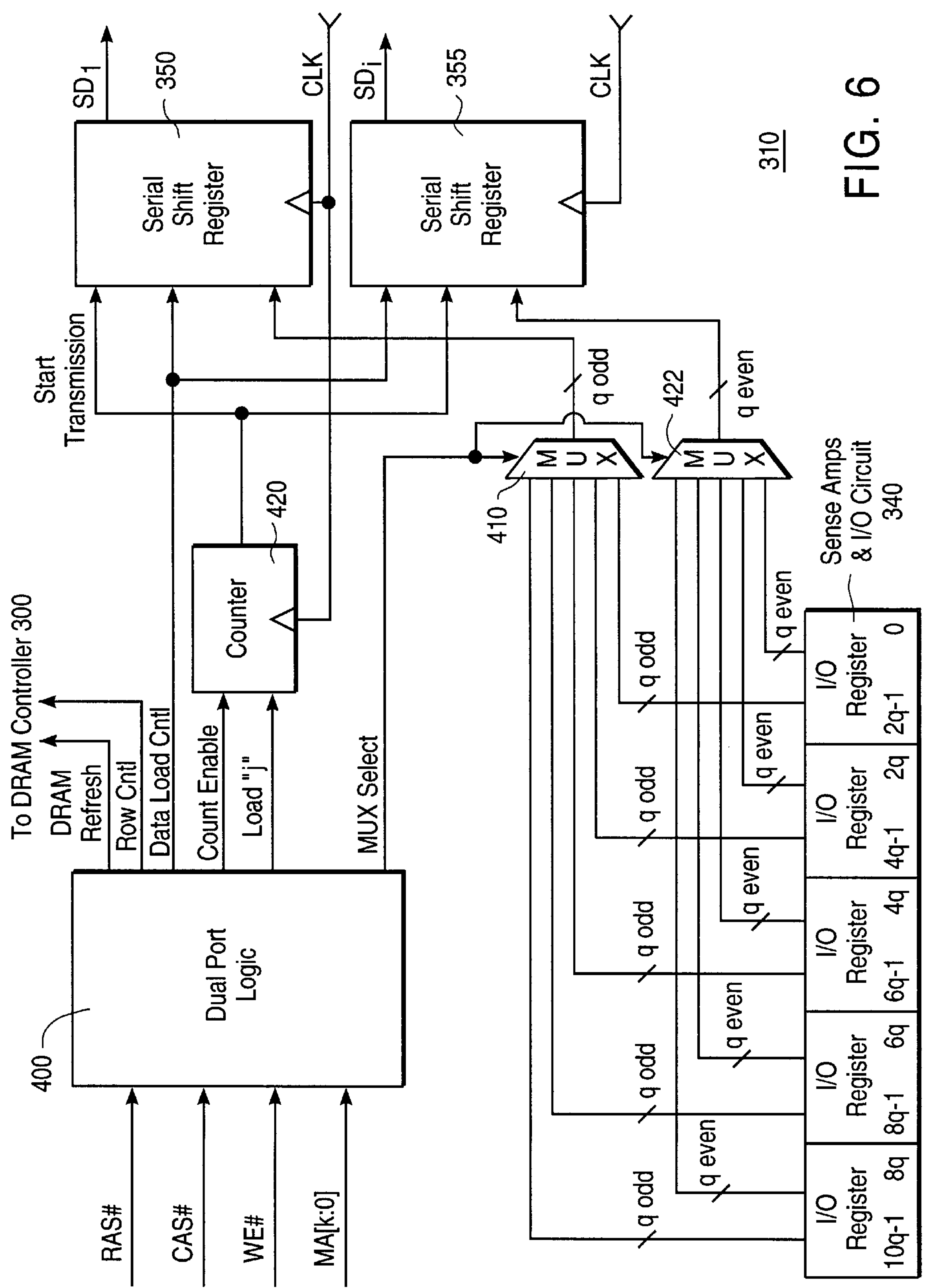
FIG. 6 illustrates one embodiment for a circuit used to execute a serial port load command for the asynchronous interface dual ported memory of the present invention.

In one embodiment, at the same time the start address is latched, the dual port logic 400, as shown in FIG. 6, loads a counter 420 with a count value "j." After the count value "j" is loaded into the counter 420, the counter 420 decrements the count value "j" on each clock cycle. After termination of "j" clock cycles in the counter 420, the output serial data $SD_1$–$SD_i$ are transmitted on the output of the serial shift register 350 (e.g. the serial output data are valid from the "j+1" cycle). The count value "j", a fixed parameter for each dual ported memory device, is calculated based on the amount of time required to provide valid data in the shift registers. Thus, this parameter may vary depending on the specific implementation of the dual ported memory.

FIG. 6 illustrates the dual port controller 310 and serial shift registers 350 and 355 configured in accordance with one embodiment of the present invention for asynchronous interface to the dual ported memory. The dual port controller 310 includes dual port logic 400, multiplexers (MUXs) 410 and 422, and a counter 420. For this example embodiment, serial shift register 350 outputs $SD_1$ and serial shift register 355 outputs $SD_2$, wherein "i" is equal to 2. Although the example embodiment shown in FIG. 6 includes two serial outputs, any number of serial outputs from any number of serial shift registers may be used.

FIG. 6 also shows input/output (I/O) registers for the sense amplifiers and I/O circuit 340. In one embodiment, the I/O registers are divided into "2q" bits, to correspond with the "q" bits stored in both the serial shift registers 350 and 355. For this example, there are five sets of "2q" bit sequences in a row of the memory array 330 (e.g. "n" columns is equal to five times "2q"). For the example embodiment shown in FIG. 6, the odd bits for the "2q" bit sequence are input to the MUX 410, and the even bits for the "2q" bit sequence are input to the MUX 422. For example, if "2q" is a single byte of data (e.g. 2q=8), then the odd bits for each "2q" bit sequence are 1, 3, 5, and 7, and the even bits for each "2q" bit sequence are 0, 2, 4, and 6. Thus, the odd "q" bits are stored in the serial shift register 350, and the even "q" bits are stored in the serial shift register 355.

In operation, the dual port logic 400 generates MUX select signals, based on the start address, to select the appropriate "2q" bit sequence for loading of the serial shift registers 350 and 355. In one embodiment, the dual port logic 400 decodes the start address to generate the MUX select signals. The start address identifies a bit on an even boundary of a "2q" bit sequence. For the example configuration shown in FIG. 6, the start address identifies a bit in locations "0", "2q", "4q", "6q", or "8q." However, one skilled in the art will appreciate that circuitry may be developed that permits selection of any bit in the row as the starting bit of the bit sequence for loading to the serial shift register 350.

The dual port logic 400 generates, in response to a DRAM refresh command, a DRAM refresh signal to the DRAM controller 300. The execution of a DRAM refresh cycle is performed under the control of the DRAM controller 300. The execution of a DRAM refresh operation is well known in the art. For a serial port load command, the dual port logic 400 generates a row control signal to latch the row address in the address buffer of the DRAM controller 300. The row control signal specifies to the DRAM controller 300 to perform a row address select cycle. Specifically, the DRAM controller 300 decodes the row address, accesses the selected row on the memory array 330, and latches sensed data for the row in the I/O registers of the sense amplifiers and I/O circuit 340.

The data load control signal, generated by the dual port logic 400, controls latching of the odd llqll bits output from the MUX 410 and the even "q" bits output from the MUX 422 for a load operation to the serial shift registers 350 and 355, respectively. As shown in FIG. 6, the dual port logic 400 is coupled to the counter 420 to effectuate the loading of the "j" count value and to enable the counter 420. To synchronize the output of serial data $SD_1$–$SD_i$, the dual port logic 400 loads the count value "j" in the counter 420 at the same time it latches the start address, and it then enables the counter 420. At the terminal count of "j" counts, the counter 420 generates a start transmission signal for the serial shift registers 350 and 355 to output the output serial data $SD_1$–$SD_i$ from the "j+1" clock cycle. The dual port logic 400 may be implemented in combinatorial or sequential logic to perform the functions described herein.

Figure 7:
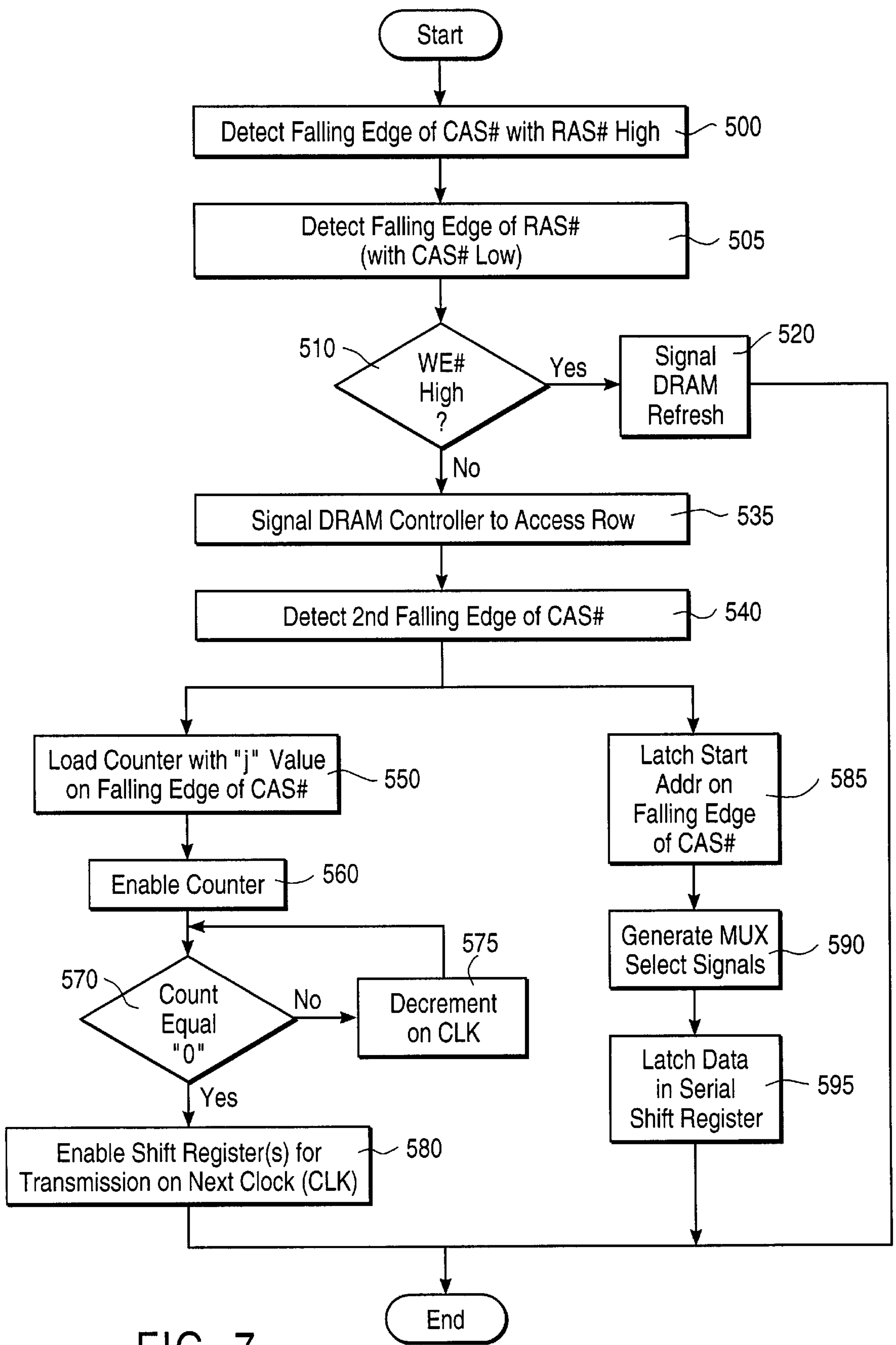
FIG. 7 is a flow diagram illustrating the method of operation for a dual port controller for the asynchronous interface dual ported memory of the present invention.

FIG. 7 is a flow diagram illustrating the method of operation for the dual port controller 310 for asynchronous interface. Initially, the falling edge of the CAS# signal is detected with the RAS# signal at a high logic level as shown in block 500. Thereafter, the falling edge of RAS# signal is detected with the CAS# signal held at a low logic level as shown in block 505. As shown in blocks 510 and 520, if the WE# signal is a high logic level, then the dual port logic 400 generates the DRAM refresh signal to indicate a DRAM refresh cycle operation. Alternatively, if the WE# signal is a low logic level, then the DRAM controller 300 is signaled as shown in block 535, and the row address is latched on the falling edge of the RAS# signal in the DRAM controller 300. Thereafter, the DRAM controller 300 accesses the row in the memory array 330.

To execute the serial port load command, the dual port controller detects the second falling edge of the CAS# signal as shown in block 540. On the second falling edge of CAS# signal, the dual port logic 400 loads the counter 420 with the count value "j" as shown in block 550 and the dual port logic 400 enables the counter 420 through the count enable signal as shown in block 560. After the counter 420 is enabled, it decrements the count value "j" every clock cycle as shown in blocks 570 and 575. At the terminal count of 0, the counter 420 generates the start transmission signal to enable the serial shift registers 350 and 355 to commence data transmission on the next clock (CLK) as shown in block 580. Parallel to loading the count value "j" into the counter 420, the dual port logic 400 latches the starting address on the falling edge of CAS# signal as shown in block 585. Based on the start address, the dual port logic 400 generates the MUX select signals as shown in block 590. Thereafter, data are latched in the serial shift registers as shown in block 595.

Figure 8:
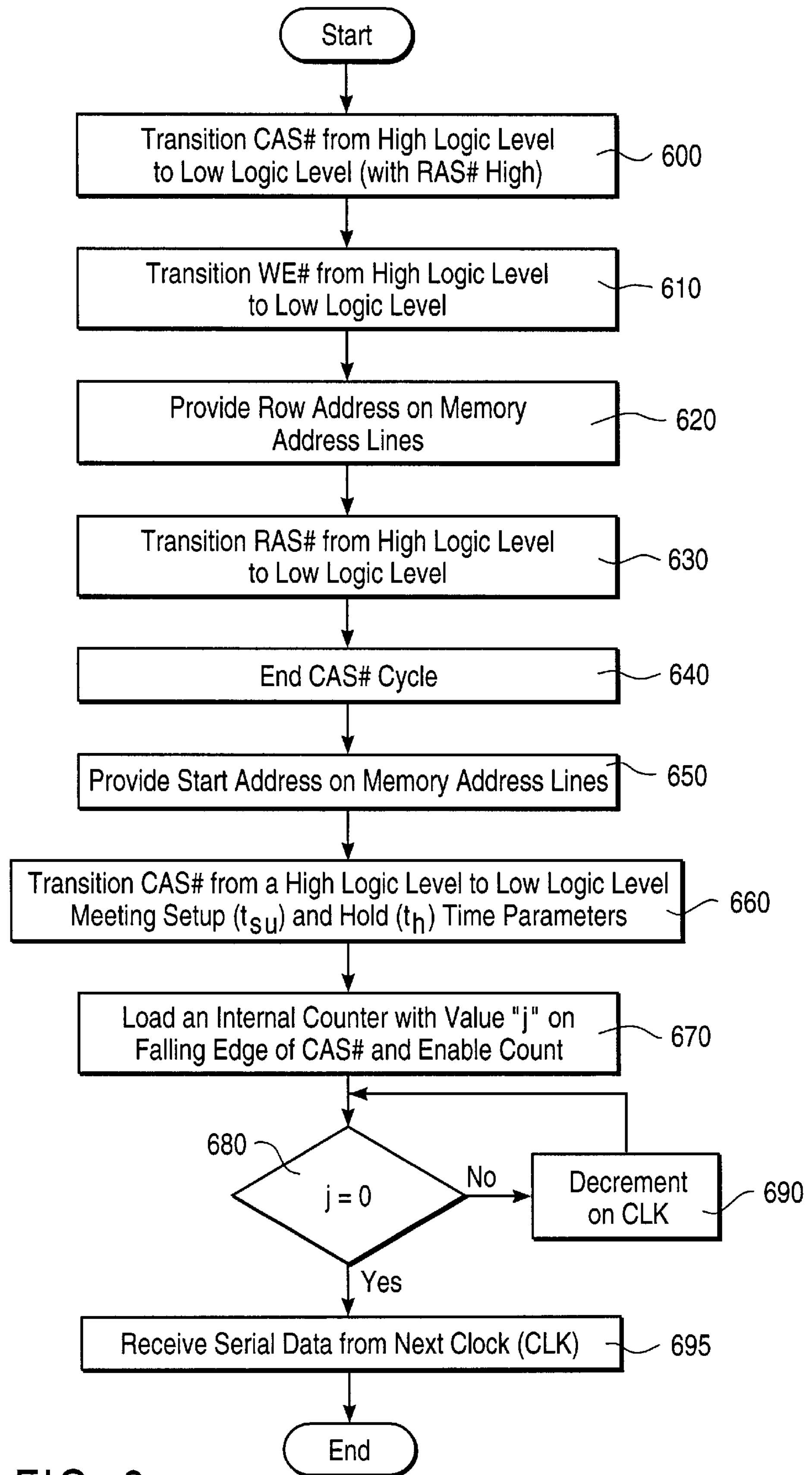
FIG. 8 is a flow diagram illustrating one embodiment for a method to operate a serial controller for use with an asynchronous interface dual ported memory.

For the asynchronous DRAM embodiment, the serial controller 240 and the dual ported memory 250 operate cooperatively to effectuate serial data transfer. FIG. 8 is a flow diagram that illustrates one embodiment for a method to operate the serial controller 240 in conjunction with an asynchronous dual ported memory. The serial controller 240 initiates a serial port load command by transitioning the CAS# signal from a high logic level to a low logic level while holding the RAS# signal at a high logic level as shown in block 600. Also, the beginning of the serial port load command further requires the serial controller 240 to transition the WE# signal from a high logic level to a low logic level as shown in block 610. Furthermore, at the beginning of the serial port load command, the serial controller 240 provides the row address on the memory address lines as shown in block 620. Thereafter, the serial controller 240 transitions the RAS# signal from a high logic level to a low logic level as shown in block 630.

The serial controller 240 ends the CAS# cycle by transitioning the CAS# signal from a low logic level to a high logic level as shown in block 640. Thereafter, the serial controller 240 provides the start address on the memory address lines as shown in block 650. Furthermore, the serial controller 240 transitions the CAS# from a high logic level to a low logic level while ensuring that the falling edge of CAS# meets the setup and hold time requirements with the clock. This operation is shown in block 660. An internal counter, contained within the serial controller 240, is loaded with the count value "j" on the falling edge of CAS#, and the internal counter is enabled as shown in block 670. The internal counter decrements, every clock cycle, the count value "j" to a terminal count of "0". The internal counter operation on the serial controller 240 is shown in blocks 680 and 690. At the terminal count (e.g. j=0), the serial controller 240 receives the serial data ($SD_1$–$SD_i$) through the serial port 260 starting with the next clock signal as shown in block 695.

Figure 9:
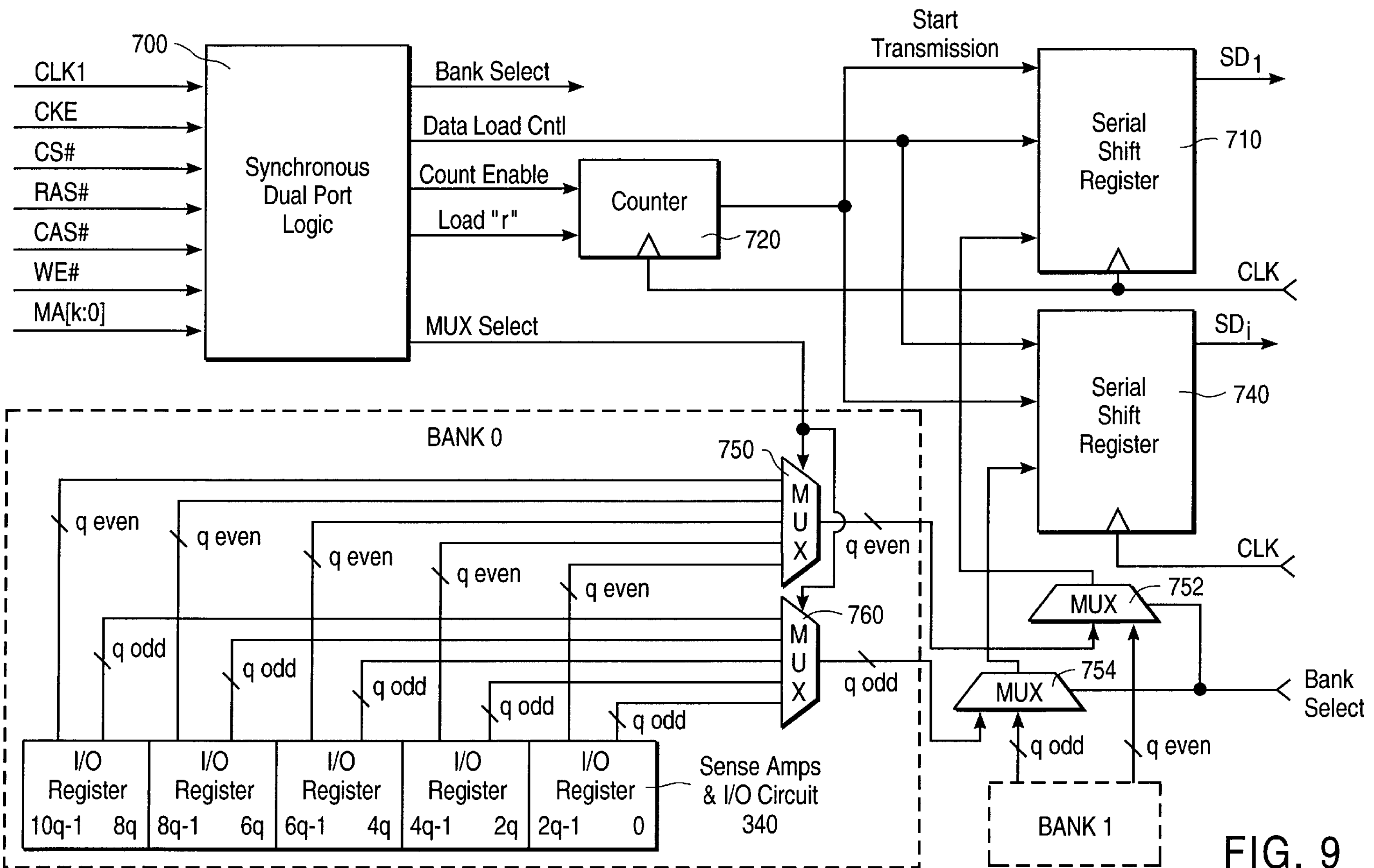
FIG. 9 is a block diagram illustrating one embodiment for a circuit used to execute a serial port load command for the synchronous interface dual ported memory of the present invention.

FIG. 9 is a block diagram illustrating one embodiment for a dual ported memory having a synchronous interface. The synchronous interface dual ported memory includes a synchronous DRAM controller, such as DRAM controller 300 in FIG. 3, and a synchronous dual port logic 700. In addition, similar to the asynchronous interface dual ported memory 250 shown in FIG. 6, the synchronous interface dual ported memory includes serial shift registers 710 and 740, a counter 720. Also, the synchronous interface dual ported memory includes a plurality of memory banks and multiplexers (MUXs) 752 and 754. Any number of memory banks may be used. However, for purposes of explanation, memory "bank 0" and memory "bank 1" are shown in FIG. 9. As shown in "bank 0" in FIG. 9, each memory bank includes multiplexers (MUXs) 750 and 760, sense amps and I/O circuit 340, and a memory array, such as memory array 330 (FIG. 3), coupled to the sense amps and I/O circuit 340.

The synchronous DRAM controller and synchronous dual port logic 700 receive a clock (CLK1) and a plurality of memory address lines (MA[k:0]). In addition, the synchronous DRAM controller and synchronous dual port logic 700 receive a plurality of control signals including clock enable (CKE), chip select bar (CS#), row address strobe bar (RAS#), column address strobe bar (CAS#), and write enable bar (WE#). The operation of a synchronous DRAM controller is well known, and any synchronous DRAM controller may be used in the synchronous interface dual ported memory of the present invention.

In general, the synchronous dual port logic 700 receives a serial port load command via these address and control signals, and it loads the serial shift registers (710 and 740) with selected portions from the memory array. The operation of the synchronous dual port logic 700 is similar, with the exception of loading and enabling the counter 720 and controlling the selection of the MUXs 752 and 754, with the dual port controller 310 discussed above in conjunction with the asynchronous interface dual ported memory embodiment. The serial shift registers 710 and 740 receive a second clock signal, labeled CLK on FIG. 9. The CLK1 and CLK clock signals may be synchronous or asynchronous to each other. All commands on the random access port are sampled using the CLK1 clock signal, and all serial data are transmitted through use of the CLK signal.

Figure 10:
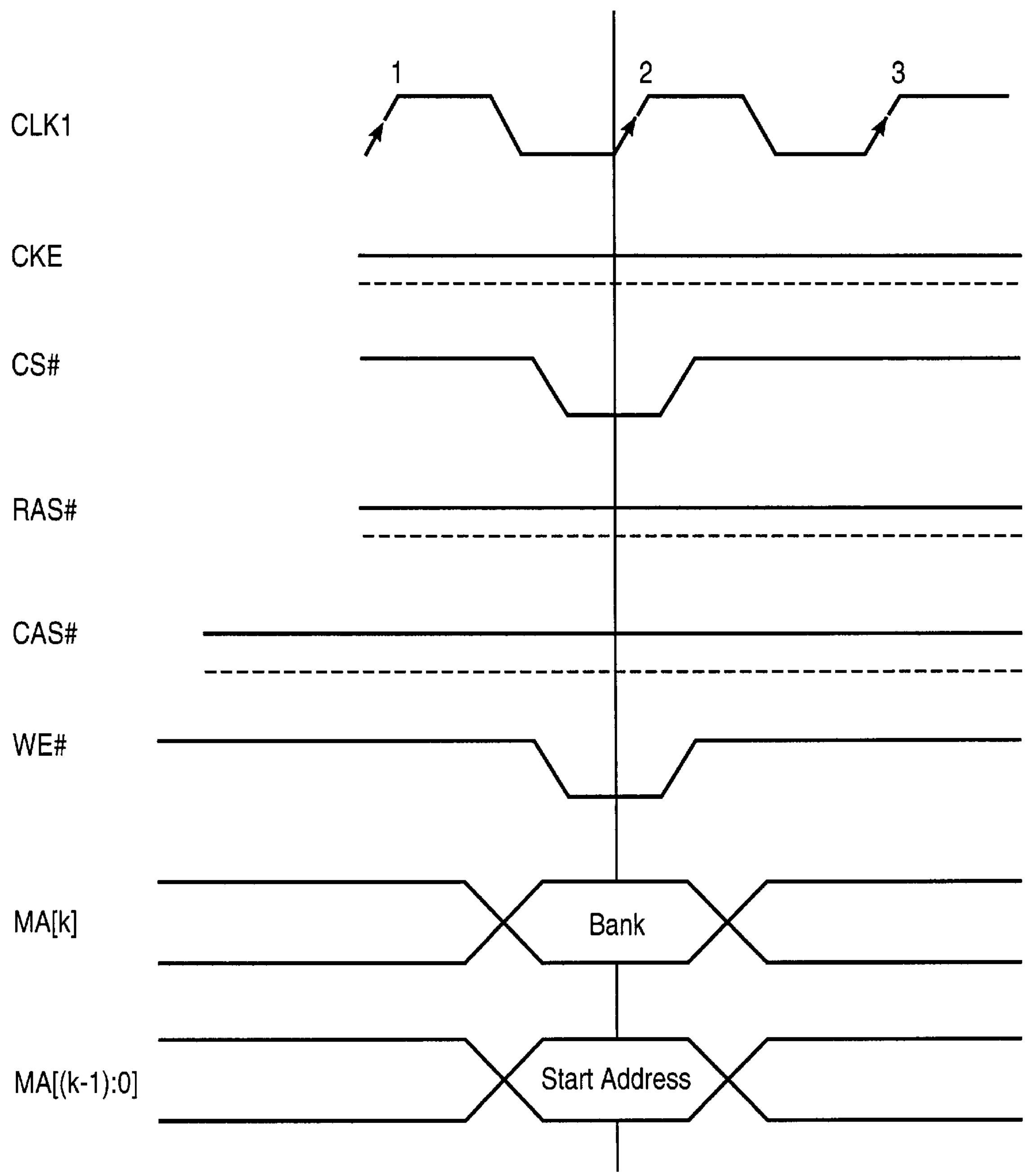
FIG. 10 is a timing diagram illustrating one embodiment for a serial port load command for a dual ported memory having a synchronous interface.

FIG. 10 is a timing diagram illustrating one embodiment for a serial port load command to a dual ported memory having a synchronous interface. For this embodiment, the serial port load command is signified by a low logic level on the chip select bar (CS#) signal, a low logic level on the write enable bar (WE#) signal, and high logic levels on row address strobe bar (RAS#), column address strobe bar (CAS#) and CKE signals. The synchronous dual port logic 700 decodes the serial port load command at any rising clock edge that these conditions occur.

The serial port load command is shown as being active on the rising edge "2" of the CLK1 clock signal. Upon sampling of the control signals (CS#, WE#, RAS#, CAS#, CKE), on the rising edge of the CLK1 clock, the synchronous dual port logic 700 samples the address line MA[k] for the internal bank identified in the serial port load command. Furthermore, the synchronous dual port logic 700 samples the serial port start address on the address lines MA[(k−1):0]. The address information in the synchronous serial port load command includes the start address of the bit in the open row that begins the bit sequence. As shown in FIG. 9, the synchronous dual port logic 700 utilizes the DRAM bank information, available on MA[k], to generate Bank select signals for MUXs 752 and 754. In turn, the MUXs 752 and 754 select "2q" bits of data from either "bank 0" or "bank 1." Thus, the "2q" bit sequence for the open row from the requested bank is loaded in the shift registers 710 and 740.

When the synchronous dual port logic 700 samples this command with the bank information and the serial port start address, it loads the data from the open row from the specified internal bank beginning at the specified start address to the serial shift registers 710 and 740. The vertical line on the timing diagram of FIG. 10 shows the sampling operation that occurs on the rising edge of the CLK1 clock signal.

For the synchronous interface dual ported memory, the output serial data ($SD_1$–$SD_i$) is synchronized with the clock signal (CLK). The output of the serial data ($SD_1$–$SD_i$), needs to be synchronized with the serial controller 240 to be read properly by serial controller 240. To achieve this, synchronous dual port logic 700 loads a count value "r" after sampling the serial port load command on the rising edge of the CLK1 signal. For the synchronous interface embodiment, the setup time ($t_{su}$) and hold time ($t_h$) conditions will be met for a serial port load (e.g. the command is synchronous to CLK1). The count value "r" represents the amount of time required to load data from the sense amps and I/O circuit 340 to the serial shift registers 710 and 740. Therefore, the count value "r" is a fixed parameter based on the particular dual ported memory device. After loading, the counter 720 is enabled, and it is decremented on each CLK clock cycle. On a terminal count of "0" (e.g. after "r" counts), start transmission signals are generated to the serial shift registers 710 and 740 to begin data transmission on the next CLK clock cycle.

Figure 11:
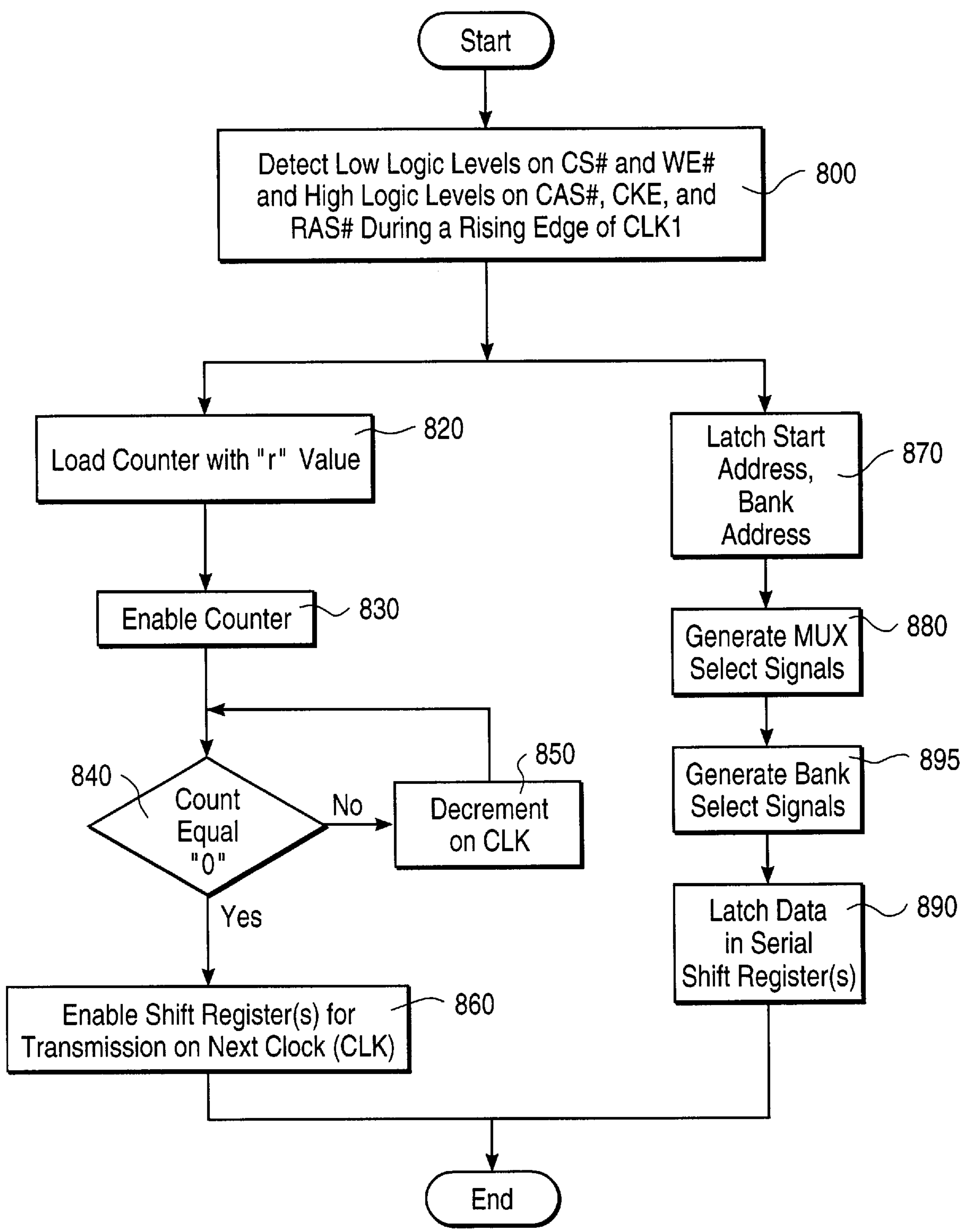
FIG. 11 is a flow diagram illustrating the method of operation for a dual port controller for the synchronous interface dual ported memory of the present invention.

The flow diagram of FIG. 11 does not include providing the row address to the synchronous interface dual ported memory. Instead, a conventional command, which accesses a row of memory with a specified row address, is issued prior to issuing the synchronous serial port load command of the present invention. Also, for the synchronous interface dual ported memory embodiment, a separate DRAM refresh command for a conventional synchronous dual ported memory is defined.

FIG. 11 is a flow diagram illustrating the method of operation for a dual port controller for the synchronous interface dual ported memory of the present invention. As shown in block 800, the synchronous dual port logic 700 detects low logic levels on CS# and WE# as well as high logic levels on CAS#, RAS#, and CKE during a rising edge of any CLK1 clock cycle. As shown in block 820, the synchronous dual port logic 700 loads the counter 720 with the "r" value. Subsequently, the counter 720 is enabled through generation of the count enable signal as shown in block 830. As shown in blocks 840 and 850, the counter 720 is decremented each CLK clock cycle to a terminal count of "0." At the terminal count of "0", the counter 720 enables the shift registers 710 and 740, through generation of the start transmission signal, to transmit data on the next clock (CLK) as shown in block 860.

As shown in the flow diagram of FIG. 11, the synchronous dual port logic 700 latches the start address and the bank address, as shown in block 870, concurrent with the loading of the counter 720 as shown in block 820. Through use of the start address, the synchronous dual port logic 700 generates the MUX select signals for MUXs 750 and 760 as shown in block 880. Also, as shown in block 895, the synchronous dual port logic 700 generates the bank select for use as a Bank select signal for MUXs 752 and 754. Furthermore, the synchronous dual port logic 700, through generation of the data load control, latches data in the serial shift registers 710 and 740 as shown in block 890.

The operation of a serial controller 240 to operate in conjunction with the dual ported memory having a synchronous interface is similar to the operation discussed above in conjunction with FIG. 8. The internal counter, which is decremented each CLK cycle, specifies to the serial controller when valid data are active on the $SD_1$–$SD_i$ lines.

Although the present invention has been described in terms of specific exemplary embodiments, it will be appreciated that various modifications and alterations might be made by those skilled in the art without departing from the spirit and scope of the invention as set forth in the following claims.

What is claimed is:

1. A unified memory architecture comprising:

a memory comprising a plurality of memory cells, for shared use as both general purpose memory and serial controller memory, and comprising a random access port and a serial port, said random access port for receiving random access memory cycles and serial port load cycles, wherein said serial port load cycles specify selected memory cells in a serial controller memory area to read from said serial port;

core logic for accessing, in response to memory access requests to a general purpose memory area, said memory through said random access port and through generation of random access memory cycles;

a serial controller coupled to said memory for generating serial port load commands during serial port load cycles to specify a first selected group of said memory cells in said serial controller memory area, and for reading data from said first selected group of said memory cells through said serial port; and wherein said core logic and said serial controller arbitrate for use of said random access port to effectuate random access cycles and serial port load cycles, respectively, and wherein said memory permits concurrent reading through said serial port of said first selected group of memory cells in said serial controller memory area, and access, via said random access port, to memory cells in said general purpose memory area subsequent to execution of a serial port load cycle.

2. The unified memory architecture as set forth in claim 1, wherein said memory comprises:

control and address inputs on said random access port for receiving control and address signals;

a dual port controller coupled to said control and address inputs on said random access port for receiving a serial port load command including address information to specify said selected group of said memory cells, said dual port controller for transferring data from said selected group of said memory cells to said serial port.

3. The unified memory architecture as set forth in claim 1, wherein said serial controller comprises a graphics controller for generating a serial port load command to effectuate data transfer to execute a screen refresh operation.

4. The unified memory architecture as set forth in claim 1, further comprising at least one central processing unit (CPU) coupled to said core logic for accessing said memory.

5. The unified memory architecture as set forth in claim 1, further comprising a peripheral bus coupled to said core logic and said serial controller.

6. The unified memory architecture as set forth in claim 5, wherein said peripheral bus comprising a peripher al component interconnect (PCI) bus.

7. The unified memory architecture as set forth in claim 5, further comprising at least one peripheral device coupled to said core logic for accessing said memory.

8. The unified memory architecture as set forth in claim 2, where in:

said random access port comprises an asynchronous interface;

said control signals comprise a row address strobe bar (RAS#), a column address strobe bar (CAS#), and a write enable bar (WE#); and said serial controller for transitioning said CAS# signal from a high logic level to an active low logic level, for generating a low logic level for said WE# signal during said active CAS#, and thereafter for transitioning said RAS# signal from a high logic level to an active low logic level to generate said serial load port command.

9. The unified memory architecture as set forth in claim 8, wherein said address information comprises a row address for selecting a row of said memory cells, said serial controller for generating said row address on said address inputs of said memory such that said row address is valid upon transitioning of said active RAS# signal.

10. The unified memory architecture as set forth in claim 9, wherein said address information further comprises a start address to identify at least one memory cell within said row of memory cells identified by said row address, said serial controller for transitioning said CAS# signal from a high logic level to an active low logic level in a subsequent cycle, and for generating a valid start address upon transitioning of said active CAS# signal.

11. The unified memory architecture as set forth in claim 1, wherein said memory c ells comprise dynamic random access memory (DRAM) cells.

12. The unified memory architecture as set forth in claim 2, wherein said control signals comprise a row address strobe bar (RAS#), a column address strobe bar (CAS#), and a write enable bar (WE#), said core logic for generating a DRAM refresh cycle to transition said CAS# signal from a high logic level to an active low logic level, for generating a high logic level for said WE# signal for said active CAS#, and thereafter for transitioning said RAS# signal from a high logic level to an active low logic level.

13. The unified memory architecture as set forth in claim 2, wherein:

said random access port comprises a synchronous interface including a first clock signal;

said control signals comprise a chip select bar (CS#), a write enable bar (WE#), a row address strobe bar (RAS#), a column address strobe bar (CAS#), and a clock enable (CKE); and said serial controller for driving, during a rising edge of said first clock signal, said CS# and said WE# signals to a low logic level and said CAS#, said RAS#, and said CKE signals to a high logic level.

14. The unified memory architecture as set forth in claim 13, wherein said address information comprises a bank identification for specifying a bank of said memory cells, said serial controller for generating said bank identification on said address inputs during said rising edge of said first clock signal.

15. The unified memory architecture as set forth in claim 14, wherein said address information further comprises a start address to identify a starting memory cell within said bank identified, said serial controller for generating a valid start address on said rising edge of said first clock signal.

16. A memory device for use in a unified memory architecture comprising:

a plurality of memory cells comprising a general purpose memory area and a serial controller memory area;

at least one serial port coupled to said memory cells for providing data from a first selected group of said memory cells in said serial controller memory area;

at least one random access port coupled to said memory cells for accessing selected memory cells in said general purpose memory, said random access port for receiving random access memory cycles and serial port load cycles, wherein said serial port load cycles specify selected memory cells in said serial controller memory area to read from said serial port; and a dual port controller coupled to said random access port for receiving a serial port load command that specifies said first selected group of said memory cells in said serial controller memory area, said dual port controller for transferring data from said first selected group of said memory cells to said serial port, wherein said memory permits concurrent reading through said serial port of said first selected group of memory cells in said serial controller memory area, and access, via said random access port, to memory cells in said general purpose memory area subsequent to execution of a serial port load cycle.

17. The memory device as set forth in claim 16, wherein said random access port comprises an asynchronous interface including control and address inputs for receiving control and address signals, and said control signals comprise a row address strobe bar (RAS#), a column address strobe bar (CAS#), and a write enable bar (WE#), said serial port load command being defined by:

said CAS# signal transitioning from a high logic level to an active low logic level;

said WE# signal being a low logic level for said active CAS#;

said RAS# signal thereafter transitioning from a high low level to an active low logic level.

18. The memory device as set forth in claim 17, wherein said address information comprises a row address for selecting a row in said memory, said row address being received on said address inputs, and said row address being valid upon transitioning of said active RAS# signal.

19. The memory device as set forth in claim 18, wherein said address information further comprises a start address to identify at least one memory cell within said row of memory cells identified by said row address, said serial port load command further being defined by:

said CAS# signal transitioning from a high logic level to an active low logic level in a subsequent cycle; and said start address being valid upon transitioning of said active CAS# signal.

20. The memory as set forth in claim 16, wherein said memory cells comprise dynamic random access memory (DRAM) cells.

21. The memory as set forth in claim 20, wherein said control signals comprise a row address strobe bar (RAS#), a column address strobe bar (CAS#), and a write enable bar (WE#), wherein a DRAM refresh cycle is defined by:

said CAS# signal transitioning from a high logic level to an active low logic level;

said WE# signal being a high logic level for said active CAS#; and said RAS# signal thereafter transitioning from a high logic level to an active low logic level.

22. The memory device as set forth in claim 16, wherein:

said random access port comprises a synchronous interface including a first clock signal;

said control signals comprise a chip select bar (CS#), a write enable bar (WE#), a row address strobe bar (RAS#), a column address strobe bar (CAS#), and a clock enable (CKE), said serial port load command being defined by:

said CS# and said WE# signals being a low logic level during a rising edge of said first clock signal; and said CAS#, said RAS# and said CKE signals being a high logic level during said rising edge of said first clock signal.

23. The memory device as set forth in claim 22, wherein said address information comprises a bank identification for specifying a bank of said memory cells, said serial port load command further being defined by said bank identification being valid on said address inputs during said rising edge of said first clock signal.

24. The memory device as set forth in claim 23, wherein said address information further comprises a start address to identify a starting memory cell within said bank identified, said serial port load command further being defined by a valid start address on said rising edge of said first clock signal.

25. A method for utilizing a single memory comprising a general purpose memory area and a serial controller memory area in a unified memory architecture, said method comprising the steps of:

accessing said general purpose memory area in said single memory, in response to memory requests, from a random access port of said single memory during random access memory cycles;

transmitting from a serial controller to said random access port, during serial port load cycles, a serial port load command to set-up transfer of a first group of selected memory cells in said serial controller memory area of said single memory; and transmitting from said serial port on said memory data from said first group of selected memory cells in said serial controller memory area to said serial controller, wherein said memory permits concurrent reading through said serial port of said first selected group of memory cells in said serial controller memory area, and access, via said random access port, to a group of said memory cells in said general purpose memory area subsequent to execution of a serial port load cycle.

* * * * *